United States Patent
Komiyama

(10) Patent No.: US 7,251,512 B2
(45) Date of Patent: Jul. 31, 2007

(54) WATER-PROOF COLLAPSIBLE CELLULAR TERMINAL APPARATUS

(75) Inventor: Takehiko Komiyama, Tokyo (JP)

(73) Assignee: NEC Corporation, Tokyo (JP)

( * ) Notice: Subject to any disclaimer, the term of this patent is extended or adjusted under 35 U.S.C. 154(b) by 484 days.

(21) Appl. No.: 10/424,094

(22) Filed: Apr. 28, 2003

(65) Prior Publication Data

US 2003/0211873 A1    Nov. 13, 2003

(30) Foreign Application Priority Data

May 13, 2002    (JP)    ............... 2002-137735

(51) Int. Cl.
*H04B 1/38*    (2006.01)
*H04M 1/00*    (2006.01)

(52) U.S. Cl. ............... 455/575.3; 455/575.1; 455/90.3; 379/433.13; 439/165; 439/164

(58) Field of Classification Search ............ 455/575.3, 455/575.1, 90.3; 379/433.13; 439/165, 439/164, 271
See application file for complete search history.

(56) References Cited

U.S. PATENT DOCUMENTS

| | | | |
|---|---|---|---|
| 5,027,394 A | | 6/1991 | Ono et al. |
| 5,141,446 A | | 8/1992 | Ozouf et al. |
| 5,432,676 A | | 7/1995 | Satoh et al. |
| 6,203,348 B1 | * | 3/2001 | Fukuda ............... 439/275 |
| 6,301,468 B1 | | 10/2001 | Slayton et al. |
| 6,484,016 B1 | | 11/2002 | Cheon |
| 6,616,467 B2 | * | 9/2003 | Ibaraki et al. ........... 439/165 |
| 6,872,088 B2 | * | 3/2005 | Watanabe ............... 439/165 |

FOREIGN PATENT DOCUMENTS

| | | |
|---|---|---|
| EP | 1 313 358 A2 | 5/2003 |
| GB | 2 295 850 A | 6/1996 |
| JP | 57-38952 | 8/1982 |
| JP | 60-225920 | 11/1985 |
| JP | 05-165784 | 7/1993 |
| JP | 6-30263 | 4/1994 |
| JP | 06-268724 | 9/1994 |
| JP | 07-212051 | 8/1995 |
| JP | 10-169780 | 6/1998 |
| JP | 2000-151772 | 5/2000 |
| JP | 2001-044877 | 2/2001 |
| JP | 2001-045123 | 2/2001 |
| JP | 2001-144837 | 5/2001 |
| JP | 2002-027066 | 1/2002 |
| JP | 2002-050997 | 2/2002 |
| JP | 2002-051131 | 2/2002 |
| JP | 2002-124779 | 4/2002 |

* cited by examiner

*Primary Examiner*—Matthew D. Anderson
*Assistant Examiner*—Yuwen Pan
(74) *Attorney, Agent, or Firm*—Young & Thompson

(57) ABSTRACT

A cellular terminal apparatus has a structure for folding an upper apparatus 2 and a lower apparatus 3 via a hinge portion 4. Printed circuit boards 5, 6 arranged in the upper apparatus 2 and the lower apparatus 3 are connected to each other by a flexible printed circuit board (FPC) 7 and a connection cable 8 passing inside the hinge portion 4. At the boundary between the hinge portion and the upper apparatus 2 and the lower apparatus 3, the space between the FPC 7, the connection cable 8, and the external case is filled by a seal packing 9 in such a manner that the FPC 7 and the connection cable 8 are separate from each other.

10 Claims, 10 Drawing Sheets

FIG.1(a)
FIG.1(b)
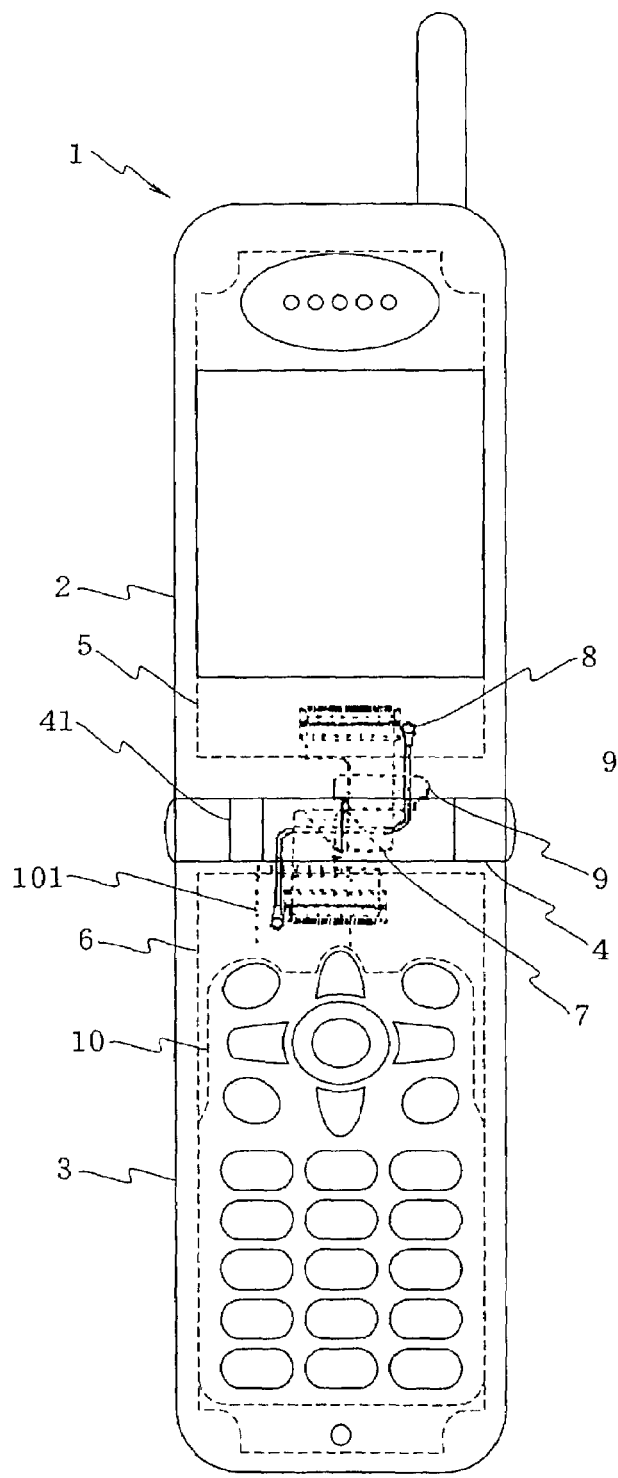
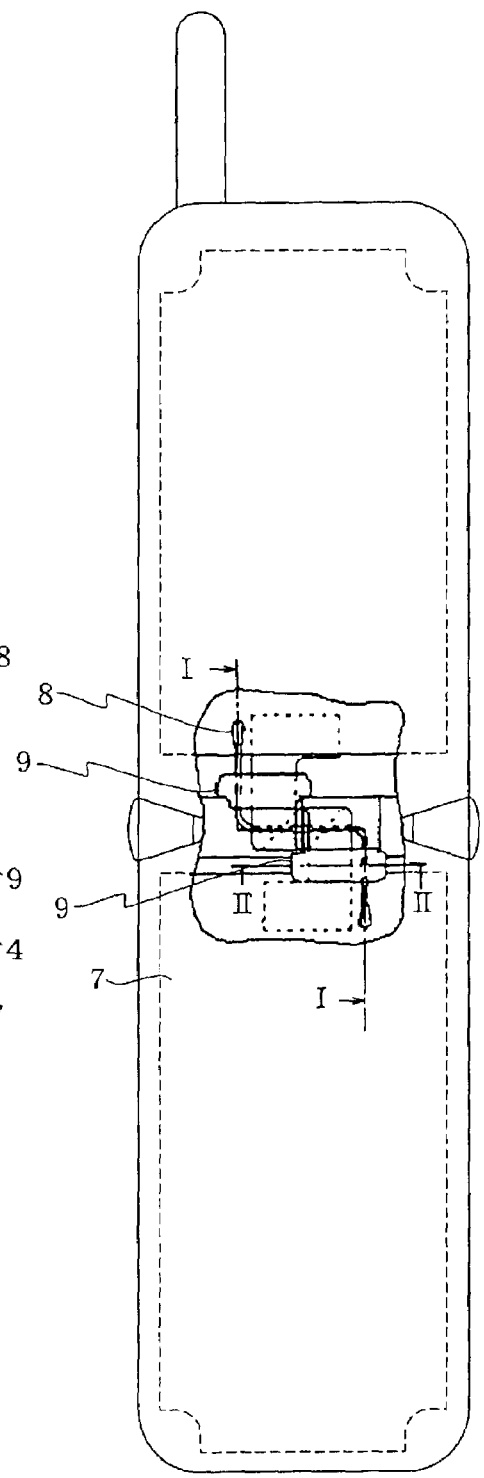

*FIG. 5*
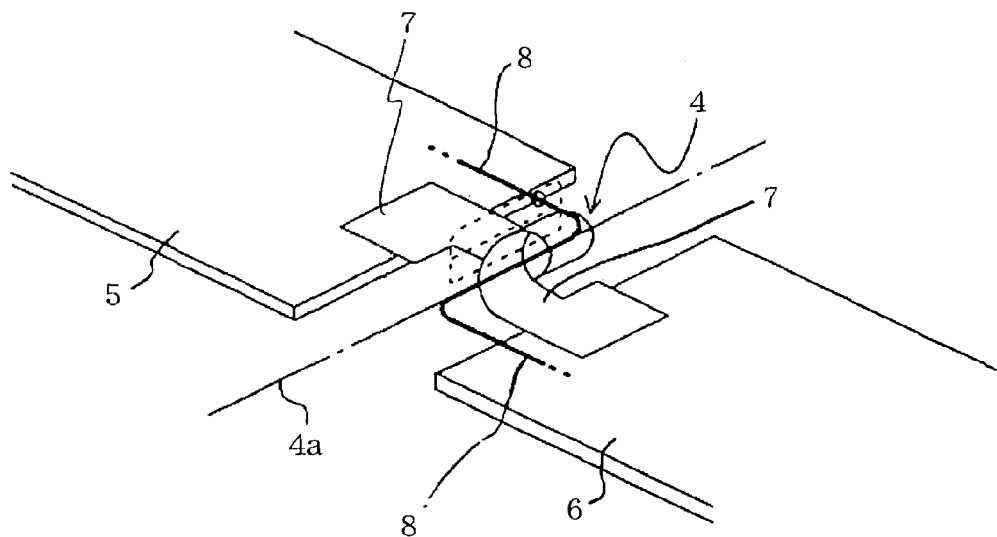
*FIG. 6(a)*          *FIG. 6(b)*
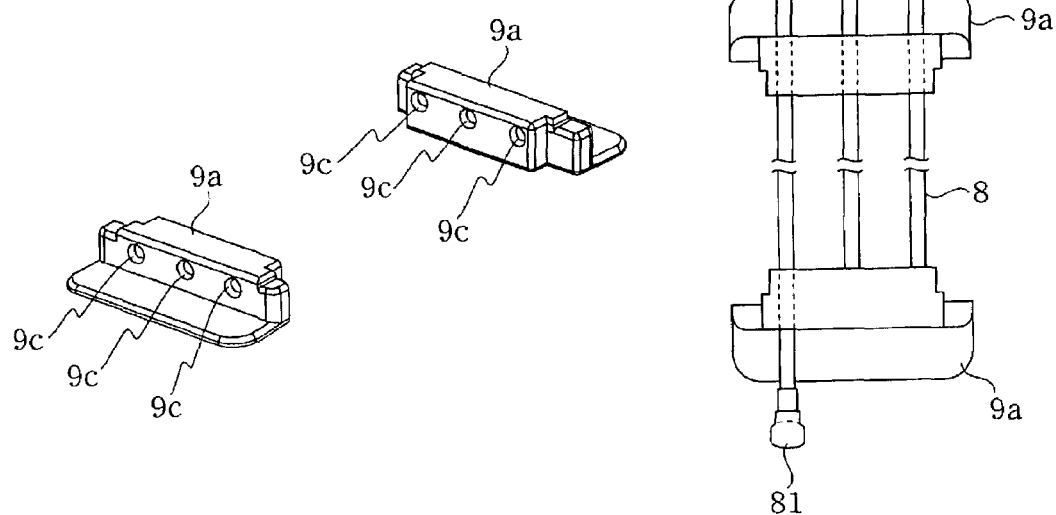

FIG. 7
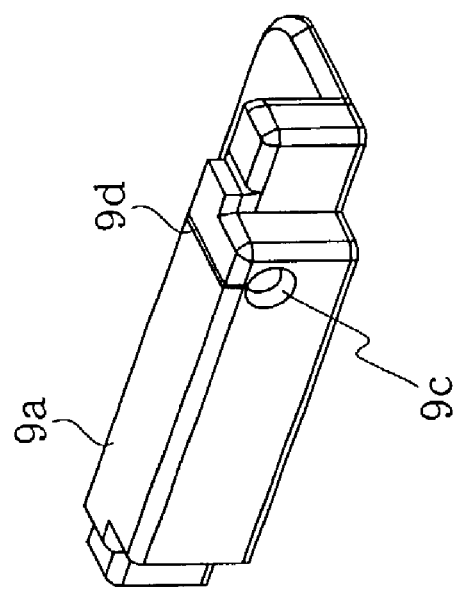
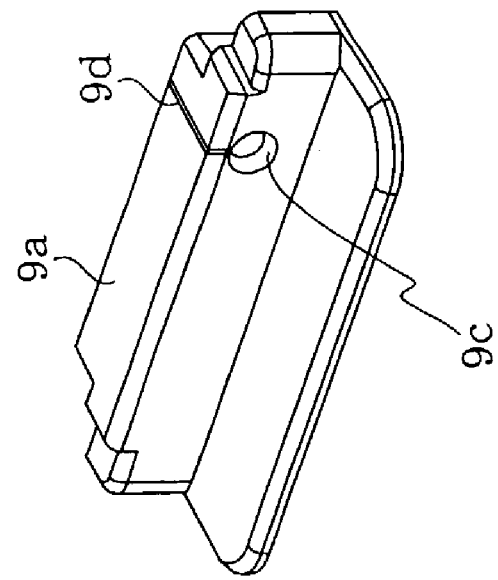

FIG.10(a) (PRIOR ART)
FIG.10(b) (PRIOR ART)
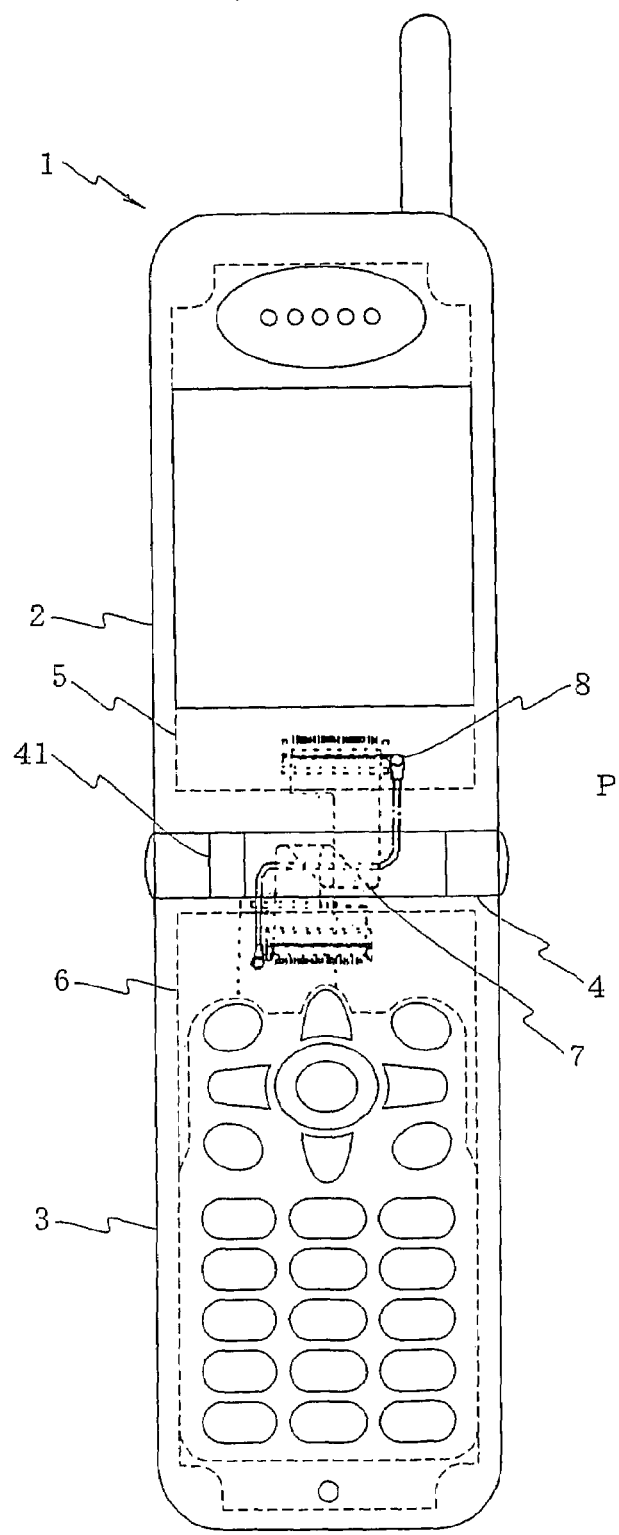
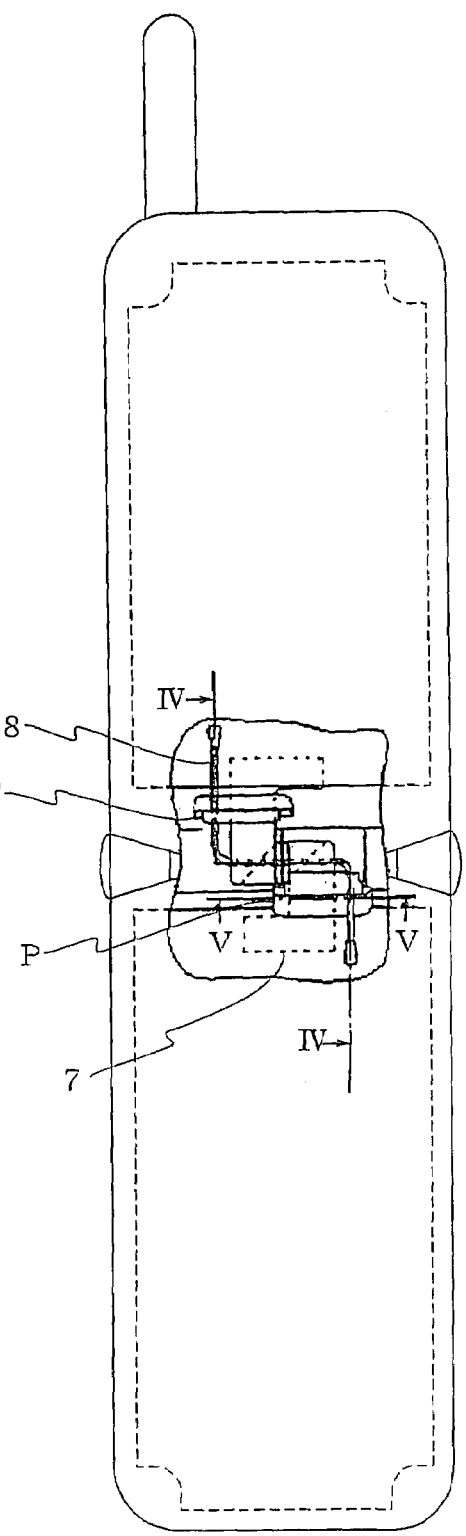

WATER-PROOF COLLAPSIBLE CELLULAR TERMINAL APPARATUS

BACKGROUND OF THE INVENTION

1. Field of the Invention

The present invention relates to a cellular terminal apparatus such as a collapsible cellular telephone and in particular, to a water-proof cellular terminal apparatus.

2. Description of the Prior Art

Conventionally, various water-proof countermeasures have been tried for the respective components of the apparatus such as a cellular telephone.

For example, Japanese Patent Laid-Open Application 2000-151772 discloses a cellular terminal apparatus having a water-proof structure against entrance of water from the peripheral portion of the key sheet as the operation unit. Moreover, Japanese Patent Laid-Open Application 10-169780 discloses a seal packing and its manufacturing method. The seal packing can preferably be used as a water-proof countermeasure against the water entrance from the engagement portion of the upper and the lower cases of the cellular terminal apparatus.

Moreover, there is a completely water-proof cellular telephone (unitary block type) having a countermeasure against water coming through a hole (sound hole, etc.) and other clearances. However, a collapsible cellular telephone, i.e., a collapsible type cellular telephone in which an upper apparatus and a lower apparatus can be folded via a hinge portion, has become more popular and there are a lot of market claims (complaint, indication, etc.) for the water entrance from the clearance at the hinge portion.

More specifically, water enters from the clearance at the hinge portion into the FPC (flexible printed circuit) arranged in the hinge portion and along the FPC reaches the printed circuit board in the upper and lower apparatuses, causing electrical problems. Here, the FPC has flexibility and is used to connect the printed circuit boards arranged in the upper and the lower apparatuses.

FIG. 8 and FIG. 9 show a configuration example of a cellular telephone having a countermeasure against the water entrance (there is a possibility of entrance of dust other than water) from the hinge portion clearance. FIG. 8 is a front view of the cellular telephone (the case is open) and a cross section about III-III is shown in FIG. 9.

In the configuration shown in FIG. 8 and FIG. 9, the space between the hinge portion 4 and the upper and lower apparatuses (upper apparatus 2, lower apparatus 3) is supplied with a seal packing P which sandwiches from upside and downside, apart of the FPC 7 as a route of water entrance into the upper and lower apparatuses 2 and 3, so that no space is left between the FPC 7 and the external case of the FPC 7. Since the seal packing mounts in the space, the FPC 7 is in pressed contact with the seal packing P. Moreover, the seal packing is in pressed contact with the case. Thus, there is no water entrance route from the hinge portion 4 to the upper and lower apparatuses 2 and 3, thereby achieving water-proof structure.

However, among the collapsible cellular telephones, there are those having a structure that a coaxial cable and the like are arranged in the hinge portion 4. The FPC 7 connecting the upper and the lower printed circuit boards 5 and 6. FIG. 10 and FIG. 11 show a configuration example of the cellular telephone in which the FPC and the cable are arranged in the hinge portion and water-proof structure using the aforementioned seal packing is provided. FIG. 10(a) is a front view of the cellular telephone and FIG. 10(b) is a rear view of the cellular telephone. FIG. 11 is a cross sectional view about IV-IV in FIG. 10(b).

As shown in FIG. 10 and FIG. 11, the connection cable (coaxial cable) 8 passes through the hinge portion 4 together with the FPC 7 and is connected to the upper and the lower printed circuit boards 5 and 6. The spaces at the boundaries between the hinge portion 4 and the upper and lower apparatuses 2, 3 are supplied with a seal packing P (four seal packing pieces are arranged in the figure) The FPC 7 and the cable 8 pass between the seal packing P pieces in the direction of the upper and the lower apparatuses 2, 3. Thus, the spaces are minimized by the seal packing P pieces so as to prevent entrance of water drops in the direction of the upper and the lower apparatuses 2, 3.

FIG. 12(a) and FIG. 12(b) shows a water-proof structure having two seal packing P pieces which sandwich the FPC 7 and the cable 8 from upside and downside. The FPC 7 is in pressed contact with the seal packing P so as to prevent entrance of water drops. The seal packing P is also in pressed contact with the external case. Moreover, the cable 8 passes through a surface where the seal packing P is in pressed contact with the FPC 7.

In the water-proof structure shown in FIG. 12(a), the FPC 7 and the cable 8 are sandwiched by the seal packing P at separate positions. In the water-proof structure shown in FIG. 12(b), the FPC 7 and the cable 8 are sandwiched together (the cable 8 is arranged on the upper surface of the FPC 7) by the seal packing P.

In the aforementioned configuration, a space S is present around the cable 8 covered by the seal packing P. Through this space S, a water drop 11 (see FIG. 9, FIG. 11) enters inside and along the FPC 7 or the cable 8, reaches the printed circuit boards 5, 6 in the upper and lower apparatuses 2, 3, thereby causing electric problems (such as short circuit).

Moreover, especially in the configuration of 12(b) where the cable 8 passes through a portion where the seal packing P is pressed contact with the FPC 7, an excessive load is applied to the FPC 7 and the cable 8 (especially onto the FPC 7). This causes a problem that the signal line in the FPC 7 is broken.

As has been described above, in the conventional configuration, no consideration has been taken on an appropriate water-proof structure for the configuration of the hinge portion passing the FPC and the connection cable.

SUMMARY OF THE INVENTION

It is therefore an object of the present invention to provide a cellular terminal apparatus such as a collapsible cellular telephone having an effective water-proof structure in the hinge portion passing the FPC and the connection cable.

It is another object of the present invention to provide a water-proof cellular terminal apparatus in which an excessive external load is not applied to the FPC or the cable.

In order to achieve the aforementioned object, the present invention provides a collapsible cellular terminal apparatus comprising: an upper apparatus and a lower apparatus which are connected so as to be folded via a hinge portion, printed circuit boards arranged in the upper apparatus and the lower apparatus, a flexible printed circuit board and a connection cable for connecting the printed circuit boards, and a water-proof structure for sealing the boundary between the hinge portion and the upper and the lower apparatus, wherein the flexible printed circuit board and the connection cable arranged between the upper apparatus and the lower apparatus pass through the water-proof structure at different positions and the water-proof structure closely seals the space between the flexible printed circuit board and the connection cable.

Moreover, the water-proof structure be preferably realized by a seal packing consisting of an upper packing piece and a lower packing piece to be combined with each other, a hole for passing the connection cable is formed in one of the upper packing piece and the lower packing piece, and the space around the flexible printed circuit board is closely sealed by matching surfaces of the upper packing piece and the lower packing piece.

Moreover, the upper packing piece preferably has a cut off portion leading to the hole.

Moreover, at least one of the upper packing piece and the lower packing piece preferably has a concave portion for pushing the flexible printed circuit board therein.

Moreover, the apparatus may comprise a plurality of connection cables passing through the water-proof structure. Moreover, the connection cable may be guided through the hole of the seal packing into the upper apparatus and the lower apparatus.

BRIEF DESCRIPTION OF THE DRAWINGS

FIG. 1(*a*) is a front view of a cellular terminal apparatus according to an embodiment of the present invention. FIG. 1(*b*) is a rear view of the cellular terminal apparatus.

FIG. 5 shows arrangement of an FPC 7 and the connection cable 8 in a hinge portion 4.

FIG. 6(*a*) and FIG. 6(*b*) show detailed configuration having a plurality of connection (coaxial) cables.

FIG. 7 shows detailed configuration of a seal packing having a cut-off portion leading to the hole for the connection cable.

FIG. 10(*a*) is a front view of a cellular telephone having an FPC and coaxial cable (connection cable) in the hinge portion. FIG. 10(*b*) is a rear view of the cellular telephone.

DETAILED DESCRIPTION OF PREFERRED EMBODIMENTS

Figure 2:
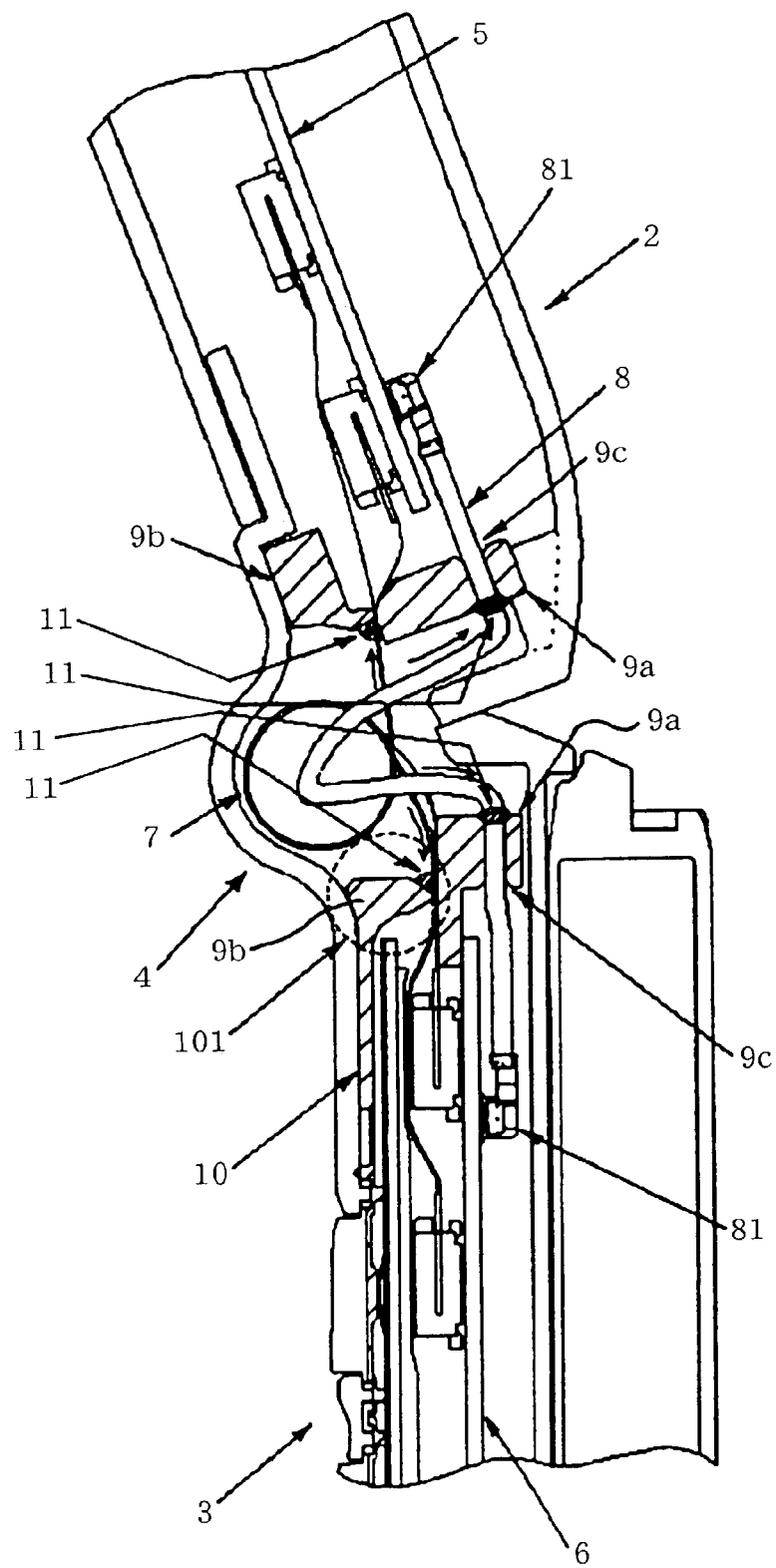
FIG. 2 is a cross sectional view about I-I in FIG. 1(*b*).

Description will now be directed to embodiments of the present invention with reference to the attached drawings. FIG. 1(*a*) is a front view of a collapsible cellular terminal apparatus 1 according to an embodiment of the present invention and FIG. 1(*b*) is a rear view of the apparatus 1. FIG. 2 is a cross sectional view about I-I in FIG. 1(*b*).

As shown in FIG. 1 and FIG. 2, the cellular terminal apparatus 1 according to the present invention basically consists of an upper apparatus 2, a lower apparatus 3, and a hinge portion 4.

The upper apparatus 2 is connected to the lower apparatus 3 via the hinge portion 4. The present invention relates to a collapsible type cellular terminal apparatus 1 in which the upper apparatus 2 and the lower apparatus 3 can be folded via the hinge portion 4 and which has water-proof structure for preventing entrance of water from a clearance 41 of the hinge portion 4.

The boundary spaces between the hinge portion 4 of the cellular terminal apparatus 1 and the upper and lower apparatuses 2, 3 are filled by a seal packing 9 so as to prevent entrance of water drop from the hinge portion 4 to the upper and lower apparatuses 2, 3.

Hereinafter, in the embodiment, like components as in the conventional example are denoted by the same reference symbols.

The upper apparatus 2 includes a display and the lower apparatus 3 includes operation input keys. In cases of the upper and lower apparatuses, printed circuit boards 5, 6 having predetermined circuits are arranged. The printed circuit boards 5, 6 are electrically connected by the FPC 7 and the connection cable 8.

The hinge portion consists of some parts. Typically, the external part (part exposed to the outer surface) is formed as a unitary block with the upper and the lower apparatuses 2, 3 and the external part is combined with a shaft part so as to be rotated. Since the hinge portion 4 is configured to be rotated, it has a clearance 41. From this clearance, materials causing operation trouble such as water and dust (especially water) can enter.

In the hinge portion 4, there passes a flexible printed circuit board (FPC) 7 connecting the printed circuit boards 5, 6 in the upper and the lower apparatuses 2, 3. Moreover, there passes a connection cable (coaxial cable) 8 connecting the printed circuit boards 5, 6. It should be noted that in this embodiment, two FPC 7 are stacked on each other but the present invention is not limited to this.

A water drop 11 through the clearance 41 of the hinge portion 4 may attach to the FPC 7 or the connection cable 8 and go along the FPC 7 or the connection cable 8. The seal packing 9 filling the spaces between the hinge portion 4 and the upper and the lower apparatuses 2, 3 prevents further entrance of the water drop 11 and especially prevents entrance of the water drop 11 to the printed circuit boards 5, 6 of the upper and the lower apparatuses 2, 3.

In FIG. 2, the hatched portions represent the seal packing 9. The seal packing 9 is arranged in the spaces at the boundary between the hinge portion 4 and the upper and lower apparatuses 2, 3. The seal packing 9 is an elastic material having a comparatively low hardness. It should be noted that in this embodiment a seal packing portion 101 is formed as a unitary block with a rubber sheet 10 which is a water-proof sheet of the key unit (operation input unit) but it can also be formed as an independent component. In the seal packing 9, the FPC 7 and the connection cable 8 are passed at two different positions. When the water drop 11 enters from the clearance of the hinge portion 4 and goes along the FPC 7 or the connection cable 8 to reach the face of the seal packing 9, the water drop 11 is stopped at that position.

Figure 3:
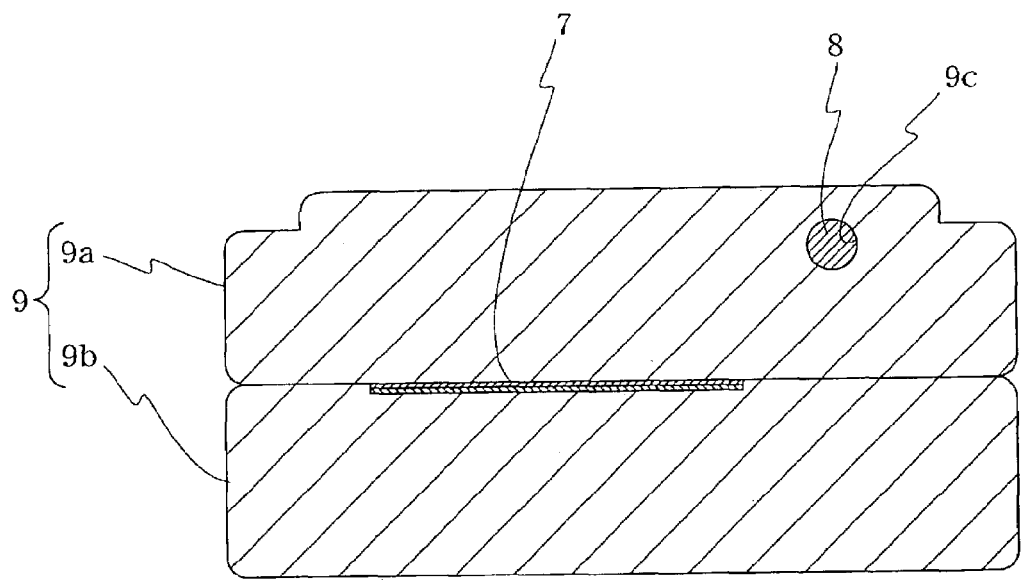
FIG. 3 is a cross sectional view about II-II in FIG. 1(*b*).
Figure 12B:
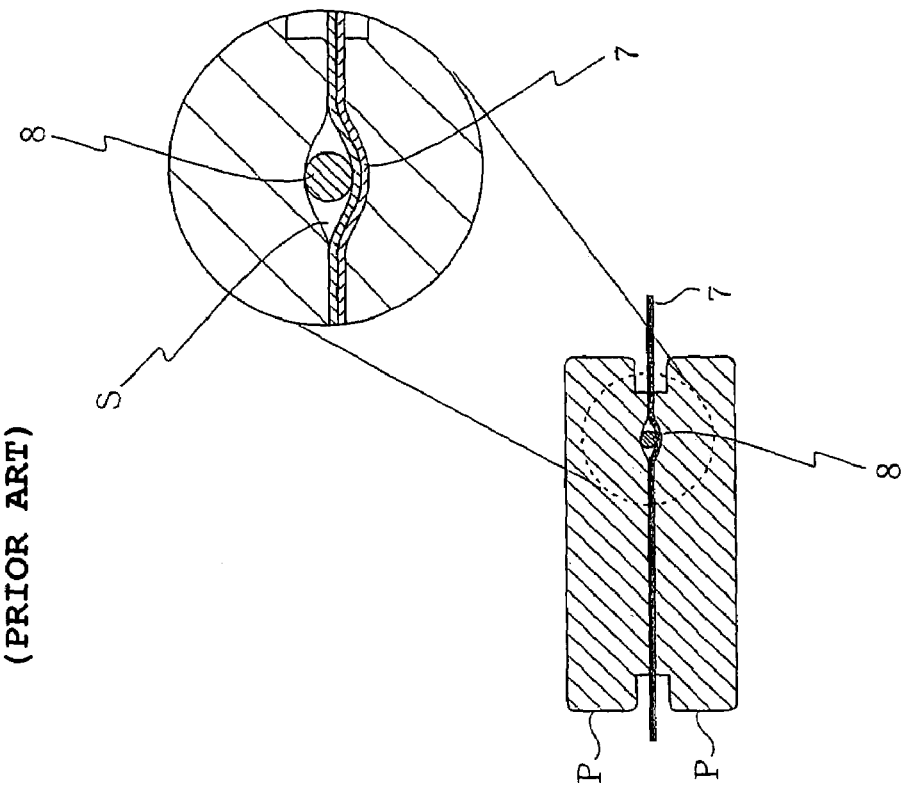
FIG. 12 is a cross sectional view about V-V in FIG. 10(*b*) having a different water-proof structure.
Figure 12A:
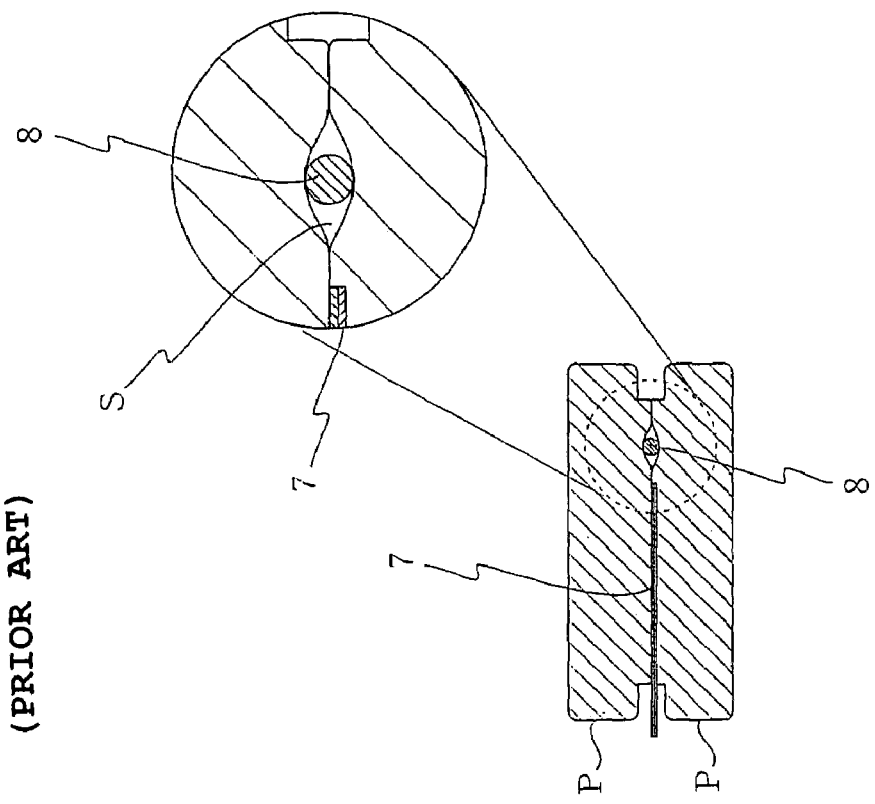

FIG. 3 is a cross sectional view about II-II in FIG. 1(*b*). As shown in FIG. 3, in this embodiment, the seal packing 9 of the upper and the lower apparatus 2, 3 consists of an upper packing piece 9*a* and a lower packing piece 9*b*. The upper packing piece 9*a* has a circular hole 9*c* so that the connection cable 8 can pass through this hole 9*c* of the upper packing piece 9*a*. The upper and the lower packing pieces 9*a*, 9*b* sandwich the FPC 7. In this case, since the seal packing 9 is an elastic material, the upper and the lower packing pieces 9*a*, 9*b* are pressed contact with the contact surface of the FPC 7 and the hole 9*c* of the upper packing piece 9*a* is in pressed contact with the connection cable 8. The lower packing piece 9*b* (or the upper packing piece 9*a*) has a matching surface having a concave portion where the flexible printed circuit board 7 is brought into in a pressed manner. Without this, leak is generated like in FIG. 12.

The seal packing 9 is in pressed contact with a case (not limited to an outermost case) containing the FPC 7 and the connection cable 8. By the seal packing 9, the FPC 7, the connection cable 8, and the case are brought into pressed contact with each other and the aforementioned space is filled by the packing, the water drop 11 cannot enter the upper and the lower apparatus 2, 3.

Figure 4A:
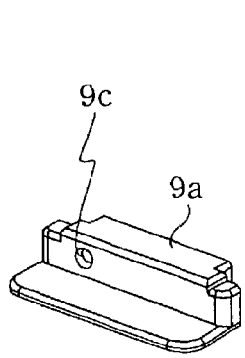
FIG. 4(*a*) and FIG. 4(*b*) shows detailed configuration of a seal packing and a connection (coaxial) cable.
Figure 4B:
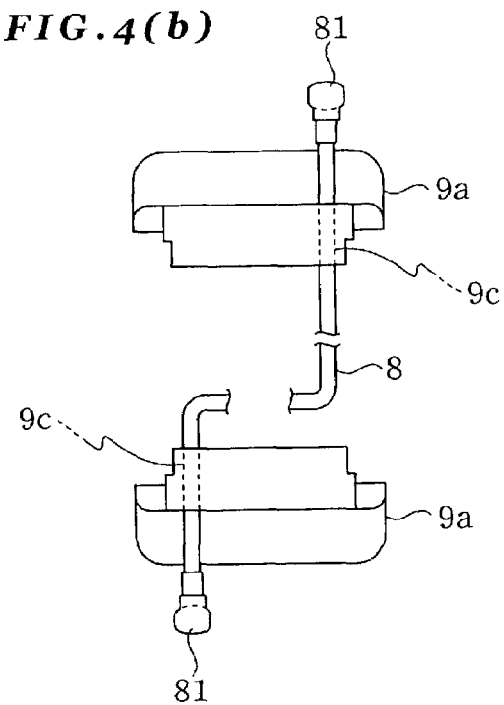
Figure 8:
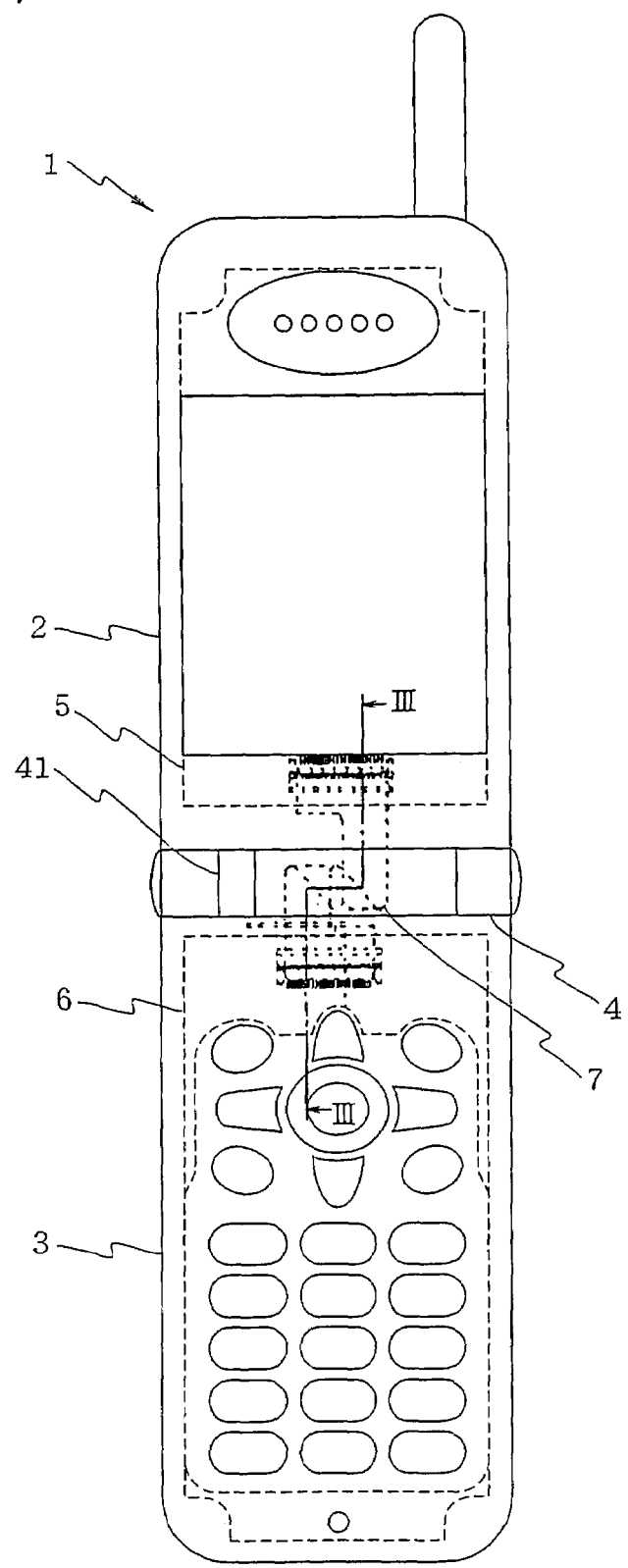
FIG. 8 shows a conventional cellular telephone having a water-proof seal packing against water entering through a clearance of the hinge portion.
Figure 9:
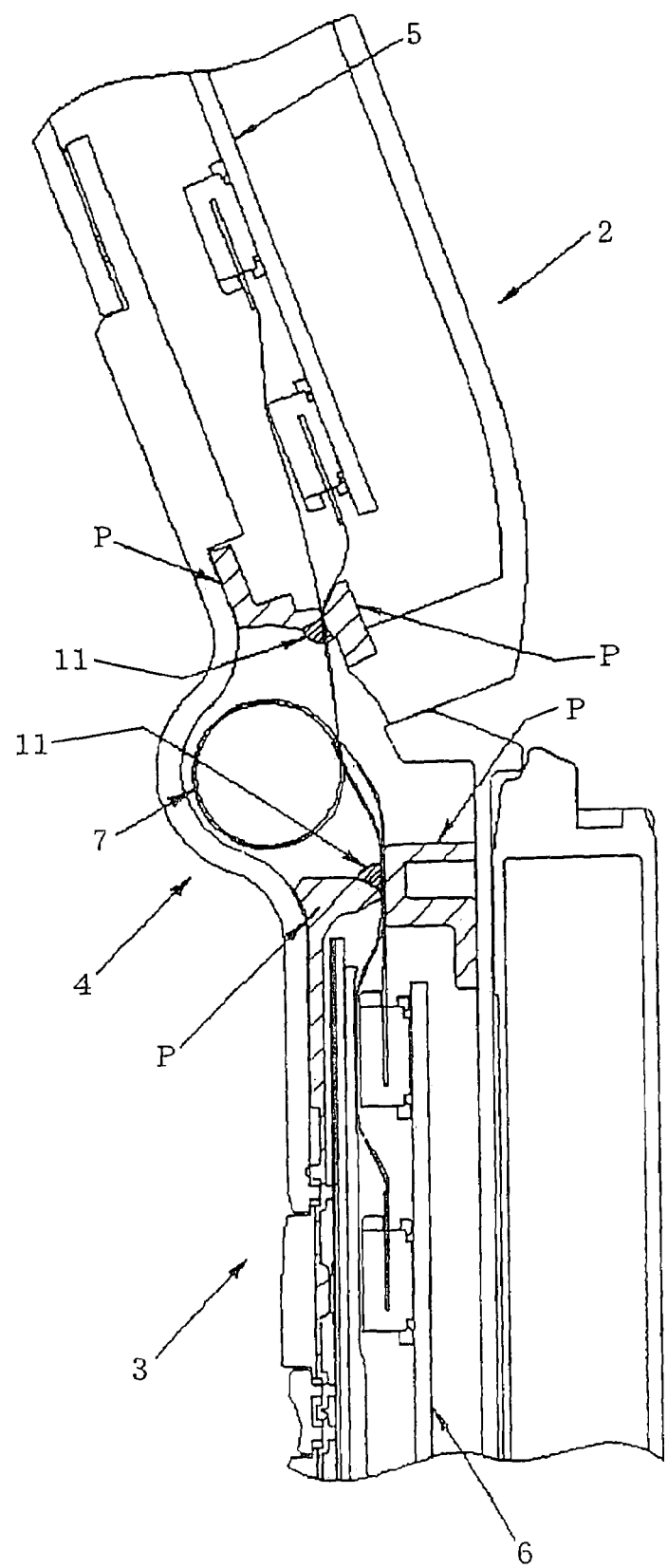
FIG. 9 is a cross sectional view about III-III in FIG. 8.
Figure 11:
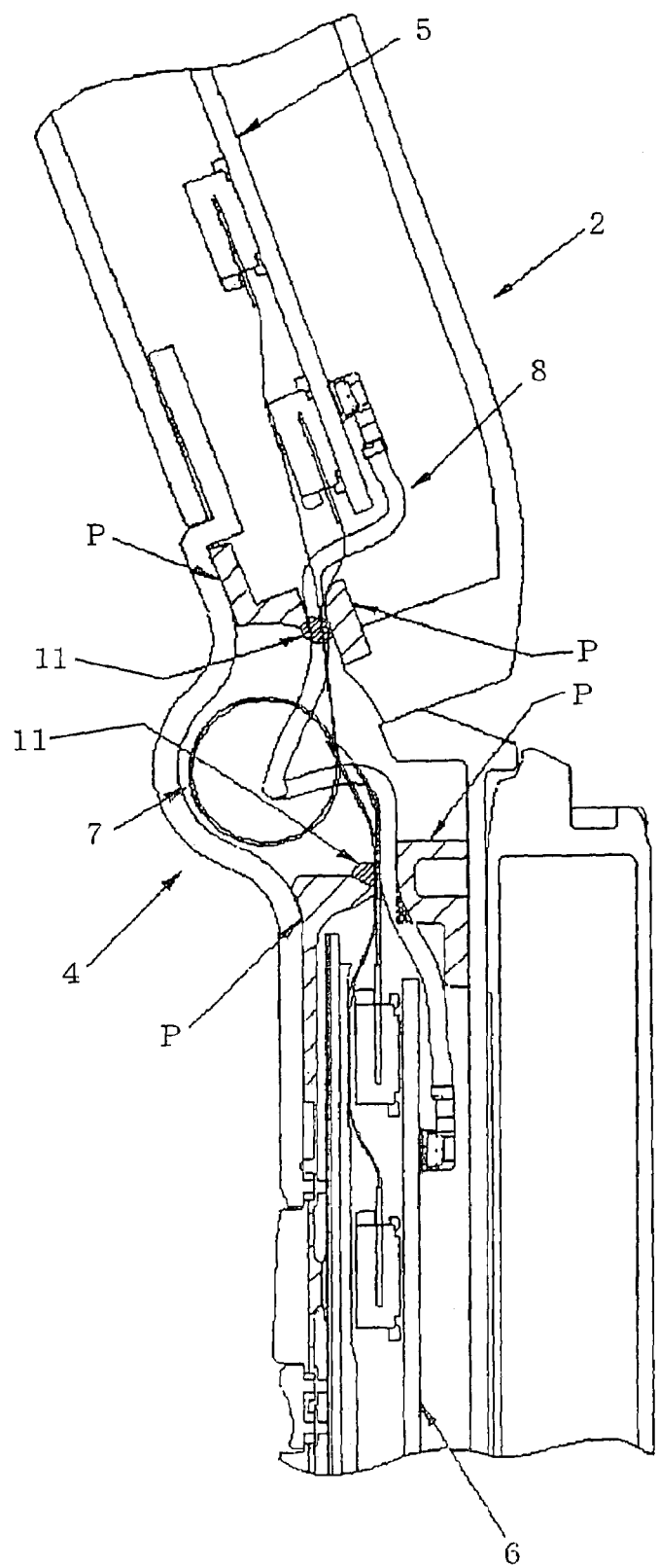
FIG. 11 is a cross sectional view about IV-IV in FIG. 10(*b*).

FIG. 4(*a*) and FIG. 4(*b*) show detailed configuration of the seal packing 9, especially the relationship between the upper packing piece 9*a* of the seal packing 9 and the connection cable 8. The upper packing piece 9*a* and the lower packing piece 9*b* of the seal packing 9 shown in FIG. 3 are respectively built in the upper apparatus 2 and the lower apparatus 3 which are connected by the hinge portion as shown in FIG. 2. The upper packing piece 9*a* and the lower packing piece 9*b* have external shapes formed corresponding to the space shapes of the apparatuses 2, 3 where they are filled. As shown in FIG. 4(*b*), the connection cable 8 passes through the hole 9*c* formed in the upper packing piece 9*a* of the seal packing 9.

As shown in FIG. 4(*a*) and FIG. 4(*b*), the hole 9*c* of the upper packing piece 9*a* has a diameter slightly smaller than the outer diameter of the connection cable 8. By making the diameter of the hole 9*c* smaller than the outer diameter of the connection cable 8, it is possible to remove the clearance between the connection cable 8 and the seal packing 9 so as to prevent entrance of a water drop. Moreover, as shown in FIG. 4 and FIG. 2, a connection piece 81 for connection to the printed circuit boards 5, 6 is attached to the both ends of the connection cable 8 passing through the hole 9*c* of the upper packing piece 9*a*.

FIG. 5 is a perspective view showing the arrangement state of the FPC 7 and the connection cable 8 at the hinge portion 4. As shown in FIG. 5 and FIG. 2, the FPC 7 makes one turn around the shaft 4*a* of the hinge portion 4 inside the hinge portion 4 and its both ends are connected to the upper and the lower printed circuit boards 5, 6. Moreover, the connection cable 8 is guided from one printed circuit board 6 to the upper packing piece 9*a* of the seal packing 9 and pulled up to the shaft 4*a* of the hinge portion 4. From that position, the connection cable 8 is pulled around the shaft 4*a* of the hinge portion 4, bent toward the other printed circuit board 5, and guided through the hole 9*c* of the upper packing piece 9*a* of the seal packing 9 so as to be pulled to the other printed circuit board 5.

In FIG. 5, the dotted line shows the seal packing 9 arranged at the side directing to the upper apparatus 2 (upper printed circuit board 5) from the hinge portion 4. It should be noted that the arrangement of the FPC 7 and the connection cable 8 in the hinge portion is only an example, and the present invention is not limited to this.

In order to realize the seal packing 9 (and the arrangement of the FPC 7 and the connection cable 8) shown in this embodiment, firstly, there is a method to mold the seal packing 9 together with the connection cable 8 as a unitary block. Moreover, there is a method of producing a seal packing 9 having the aforementioned hole 9*c* and the connection cable 8 is passed through the hole 9*c* of the seal packing 9 before attaching the connection piece 81 of the connection cable 8. Then, the connection piece 81 is attached to the connection cable 8.

At the boundary between the hinge portion 4 and the upper and lower apparatuses 2, 3, spaces between the FPC 7, the cable 8, and the case containing them is filled by the seal packing 9 in such a manner that the FPC 7 and the cable 8 are at separate positions. Accordingly, no excessive external force is applied by the seal packing 9 to the FPC 7 and the connection cable 8. Since no excessive external force is applied to the FPC 7, it is possible to prevent damage of the FPC 7.

As shown in FIG. 2, in the cellular terminal apparatus 1 according to the present invention, even if a water drop 11 enters through the hinge portion clearance and goes along the FPC 7 and the connection cable 8 in the direction of the arrows, the water drop cannot enter inside over the seal packing 9.

Description will now be directed to another embodiment of the present invention. There may be a plurality of connection cables 8 connecting the upper and the lower printed circuit boards 5, 6. FIG. 6 shows a detailed configuration having a plurality of connection cables 8 passing through the hinge portion 4. Holes 9*c* for the number of the connection cables are provided at separate positions in the upper packing piece 9*a* of the seal packing 9. The figure shows an example of configuration having three connection cables 8. It should be noted that the holes 9*c* formed in the upper packing piece 9*a* of the seal packing 9 are provided at positions not interfering the FPC 7.

FIG. 7 shows a still another embodiment in which the connection cable 8 is passed through the seal packing 9 in another method. That is, there is provided a cut off portion 9*d* leading to the hole 9*c* formed in the upper packing piece 9*a* of the seal packing 9, so that the connection cable 8 is fitted in the hole 9*c* using the cut off portion 9*d*.

As shown in FIG. 7, when the cut off portion 9*d* is provided on the hole 9*c* formed in the upper packing piece 9*a* of the seal packing (the cut off portion is such that no water drop can enter), the connection cable 8 having the connection piece 81 can be pushed into the hole 9*c* through the cut off portion 9*d*. This configuration has a merit that the seal packing 9 and the connection cable 8 can be easily assembled.

It should be noted that the embodiments have been explained with an example of the cellular telephone as the cellular terminal apparatus 1. However, the present invention relates to the water-proof structure not limited to the cellular telephone and can be widely applied to a collapsible apparatus having a hinge portion.

The embodiments of the present invention have been explained above. The embodiments show only examples of the preferable embodiments of the present invention. The present invention is not to be limited to these embodiments but can be modified in various ways without departing from the spirit of the invention.

As is clear from the above-given explanation, according to the present invention, it is possible to prevent entrance of water or dust which may enter through the clearance of the hinge portion into printed circuit boards of the upper and lower apparatuses even when the water or the dust adheres to the FPC or the connection (coaxial) cable. Moreover, since the water-proof structure for the FPC (pressed contact by the seal packing) and the water-proof structure for the connection cable (passing through the hole of the seal packing) are provided separately, it is possible to obtain pressed contact between the components without applying an excessive outer force to the FPC or the connection cable. Thus, it is possible to prevent damage of the plurality of signal lines in the FPC by the external force.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2002-137735 (Filed on May 13, 2002) including specification, claims, drawings and summary are incorporated herein by reference in its entirety.

What is claimed is:

1. A collapsible cellular terminal apparatus comprising:
an upper apparatus and a lower apparatus which are connected so as to be folded via a hinge portion,
first and second printed circuit boards arranged, respectively, in the upper apparatus and the lower apparatus,
a flexible printed circuit board and a connection cable for connecting the first and second printed circuit boards, and
a water-proof structure for sealing the boundary between the hinge portion and the upper and the lower apparatus,
wherein the flexible printed circuit board and the connection cable pass through the water-proof structure at positions that are separated from each other by an undivided portion of the water-proof structure,
wherein the flexible printed circuit board defines a plane where it passes through the water-proof structure and the connection cable is spaced from the plane by a non-zero distance, and
wherein the undivided portion of the water-proof structure closely seals the space between the flexible printed circuit board and the connection cable.

2. A collapsible cellular terminal apparatus as claimed in claim 1, wherein the water-proof structure comprises a seal packing with an upper packing piece and a lower packing piece that contact each other along a boundary,
wherein a hole for passing the connection cable is formed in one of the upper packing piece and the lower packing piece, the hole being spaced from the boundary, and
wherein a space around the flexible printed circuit board is closely sealed by adjoining surfaces of the upper packing piece and the lower packing piece.

3. A collapsible cellular terminal apparatus as claimed in claim 2, wherein the upper packing piece has a cut off portion leading to the hole.

4. A collapsible cellular terminal apparatus as claimed in claim 2, wherein the adjoining surface of at least one of the upper packing piece and the lower packing piece has a concave portion that receives the flexible printed circuit board.

5. A collapsible cellular terminal apparatus as claimed in claim 1, the apparatus comprising a plurality of connection cables passing through the water-proof structure.

6. A collapsible cellular terminal apparatus as claimed in claim 2, wherein the connection cable is guided through the hole of the seal packing, and is arranged between the upper apparatus and the lower apparatus.

7. A collapsible cellular terminal apparatus, comprising:
an upper portion and a lower portion that are foldably attached to each other with a hinge;
first and second circuit boards in the upper and lower portions, respectively, the first and second circuit boards being connected to each other with a connection cable;
a flexible circuit board that extends from the upper portion to the lower portion;
a water-proof structure that seals boundaries between the hinge and the upper and lower portions, the water-proof structure having
first and second packing parts in the upper portion, where the first and second packing parts contact each other along a first boundary and the flexible circuit board is sealably held at the first boundary, and
third and fourth packing parts in the lower portion, where the third and fourth packing parts contact each other along a second boundary and the flexible circuit board is sealably held at the second boundary; and
one of the first and second packing parts having a first opening therethrough, the first opening being separated from the first boundary by nonzero distance, and one of the third and fourth packing parts having a second opening therethrough, the second opening being separated from the second boundary by a non-zero distance, said connection cable passing through both the first and second openings, which are both sealed water-tight.

8. A collapsible cellular terminal apparatus, comprising:
a first portion and a second portion that are foldably attached to each other with a hinge, the first portion housing an operation input unit with keys;
a water-proof sheet in the first portion that provides a water-proof seal for the keys;
first and second circuit boards in the first and second portions, respectively, the first and second circuit boards being connected to each other with a connection cable;
a flexible circuit board that extends between the first portion and the second portion;
a water-proof structure that seals boundaries between the hinge and the first and second portions, the water-proof structure having a first packing part in the first portion and a second packing part in the second portion, the first packing part being a unitary block with the water-proof sheet,
where the flexible circuit board passes through each of the first and second packing parts and where the first and second packing parts each create a first water-tight seal around the flexible circuit board,
where the connection cable passes through each of the first and second packing parts and where the first and second packing parts each create a second water-tight seal around the connection cable, the first and second water-tight seals being separated from each other by an undivided part of a respective one of the first and second packing parts.

9. The apparatus of claim 8, wherein the flexible printed circuit board defines a plane where it passes through each respective one of the first and second packing parts and a place of passage of the connection cable through each respective one of the first and second packing parts is spaced from the plane by a non-zero distance.

10. The apparatus of claim 8, wherein each of the first and second packing parts comprises two sections that are separated by a boundary, where the flexible circuit board is sealably held at the boundary, and wherein a place of passage of the connection cable through each respective one of the first and second packing parts is spaced from the respective boundary by a non-zero distance.

* * * * *